United States Patent
Liu (10) Patent No.: US 8,154,033 B2
(45) Date of Patent: Apr. 10, 2012

(54) LED DEVICE AND METHOD OF PACKAGING THE SAME

(75) Inventor: Yu-Huan Liu, Taipei Hsien (TW)

(73) Assignee: Everlight Electronics Co., Ltd., Shulin Dist., New Taipei (TW)

( * ) Notice: Subject to any disclaimer, the term of this patent is extended or adjusted under 35 U.S.C. 154(b) by 73 days.

(21) Appl. No.: 12/648,306

(22) Filed: Dec. 29, 2009

(65) Prior Publication Data

US 2010/0163892 A1    Jul. 1, 2010

(30) Foreign Application Priority Data

Dec. 29, 2008  (TW) ................................ 97151186 A (51) Int. Cl.
*H01L 33/00* (2010.01)

(52) U.S. Cl. ....... 257/89; 257/98; 257/99; 257/E33.061; 257/E33.01; 438/27; 438/28

(58) Field of Classification Search .................... 257/88, 257/89, 98–100, E33.01, E33.059, E33.066, 257/E33.061, E33.067; 438/27–29
See application file for complete search history.

(56) References Cited

U.S. PATENT DOCUMENTS

| | | | |
|---|---|---|---|
| 5,998,862 A | 12/1999 | Yamanaka | |
| 6,784,458 B1 * | 8/2004 | Wang et al. | 257/79 |
| 2004/0051111 A1 | 3/2004 | Ota | |
| 2005/0005256 A1 * | 1/2005 | Rittman | 716/19 |
| 2005/0269591 A1 | 12/2005 | Chen | |
| 2006/0157724 A1 * | 7/2006 | Fujita | 257/99 |
| 2006/0186430 A1 | 8/2006 | Park | |
| 2006/0261364 A1 | 11/2006 | Suehiro | |
| 2007/0102722 A1 * | 5/2007 | Ishizaka et al. | 257/99 |
| 2007/0200130 A1 * | 8/2007 | Behringer et al. | 257/99 |
| 2009/0021140 A1 * | 1/2009 | Takasu et al. | 313/502 |
| 2010/0237361 A1 * | 9/2010 | Sakai et al. | 257/88 |

FOREIGN PATENT DOCUMENTS

| | | |
|---|---|---|
| CN | 1822365 A | 8/2006 |
| CN | 101232061 A | 7/2008 |

* cited by examiner

*Primary Examiner* — Victor A Mandala
*Assistant Examiner* — Whitney T Moore
(74) *Attorney, Agent, or Firm* — Winston Hsu; Scott Margo (57) ABSTRACT

A light emitting diode (LED) device including a transparent substrate, a plurality of LED chips, a circuit, and a transparent encapsulant is provided. The LED chips are fixed on the transparent substrate, and utilized for radiating at least a light beam. The circuit is disposed on the transparent substrate and electrically connected to the LED chips. The transparent encapsulant is utilized for packaging the LED chips. The light beam of the LED chips can propagate from two opposite sides of the transparent substrate. Blue LED chips and the circuit of the transparent substrate can be directly soldered, and the phosphors are arranged to convert the wavelength of blue light, so a dual-side white light emitting device can therefore be provided.

20 Claims, 8 Drawing Sheets

LED DEVICE AND METHOD OF PACKAGING THE SAME

BACKGROUND OF THE INVENTION

1. Field of the Invention

The present invention relates to a dual-side white light emitting device and a method of packaging the same.

2. Description of the Prior Art

Compared with traditional cold cathode light source, the LED package components are smaller in size, lower in power consumption, while having a better performance in brightness, colorfulness and a higher reaction speed to allow for high-frequency operation. Besides, the components of LED package are environmentally friendly in that they are recyclable and impact resistant. Also they can be easily developed into thin-and-small sized products. All those advantages described above make the LED packages more competitive in the market. Generally speaking, the traditional LED package includes a package cup and a LED chip which is fixed on the cup. The traditional package cup has two inner terminals and two outer terminals. The inner terminals can be soldered to the positive electrode and negative electrode of the LED to form the electric connection. And the outer terminals are used to electrically connect to an opaque printed circuit board (PCB). In addition, the PCB also provides electric connection with external controlling device via its outer terminal which enables ECD to get electronically connected with the LED chip through the circuit of PCB and package cup.

As mentioned above, traditional method of LED integration is to mount the LED chip on the cup to form a LED package. Then, several LED package components are connected to PCB to form a LED device. In addition to the inevitable increase in its size, the complexity of production will also grow accordingly, which not only increases the production costs but also limits the application of LED device at the same time. Therefore, to produce a light LED device providing excellent optical effect is an important challenge in the development of LED technology.

SUMMARY OF THE INVENTION

Therefore, one of the objectives of this invention is to provide an LED device and the related package method to simplify the process and minimize the size. The provided LED device can also be used as a dual-side white LED.

According to the preferred embodiment of the present invention, an LED device includes a first transparent substrate, a plurality of LED chips mounted on the first transparent substrate to emit at least one light beam having a first wavelength, a transparent encapsulant encapsulating the LED chips, and a circuit formed on the first transparent substrate. The circuit is electrically connected to the LED chips. The LED chips emit a part of the light beam in one side of the first transparent substrate and emit a part of light beam penetrating through the first transparent substrate in the opposite side thereof.

From one aspect of the present invention, a method of packaging an LED device is disclosed. First, a first transparent substrate is provided. Subsequently, a circuit is formed on the first transparent substrate. Next, a plurality of LED chips are mounted on the transparent substrate, and electrically connecting the LED chips to the circuit. Furthermore, a transparent encapsulant is formed on the first transparent substrate to encapsulate the LED chips.

Since this invention placed the LED chip on the first transparent substrate, the LED package is also a dual-side white LED. Moreover, the LED chip is directly fixed on the first transparent substrate, and electrically connected with it. Therefore, this invention can simplify the production of LED and provide a light LED device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
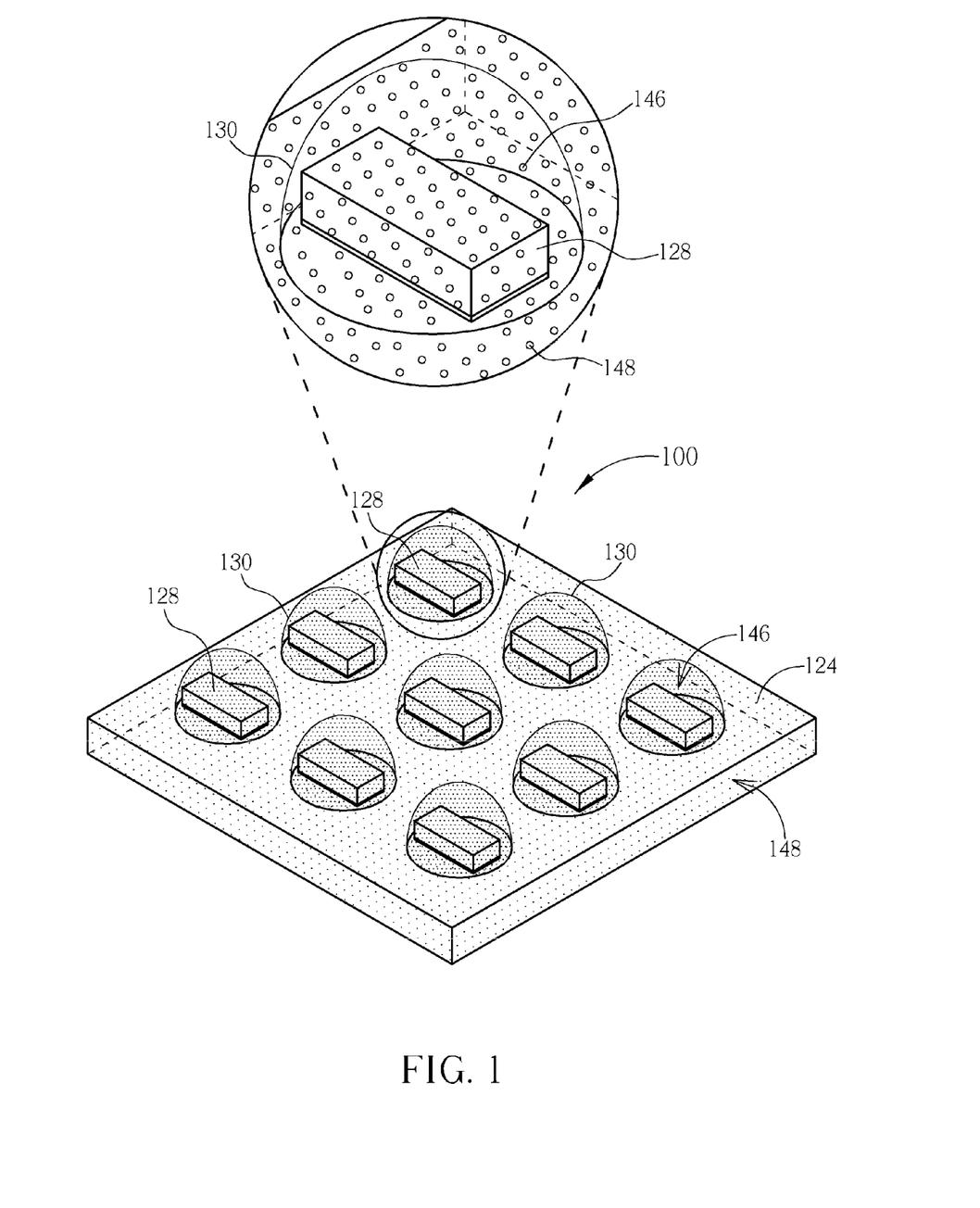
FIG. 1 is a schematic structural diagram illustrating a LED device in accordance with a first preferred embodiment of the present invention.
Figure 2:
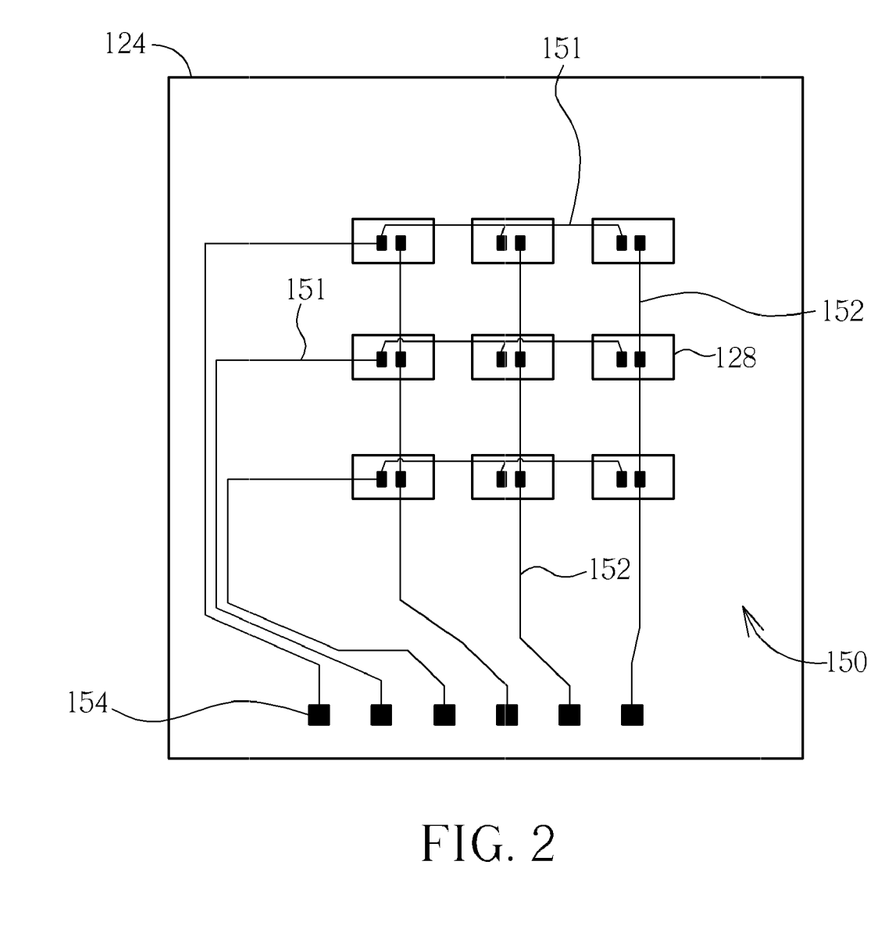
FIG. 2 is a schematic top view illustrating the first transparent substrate shown in FIG. 1.
Figure 3:
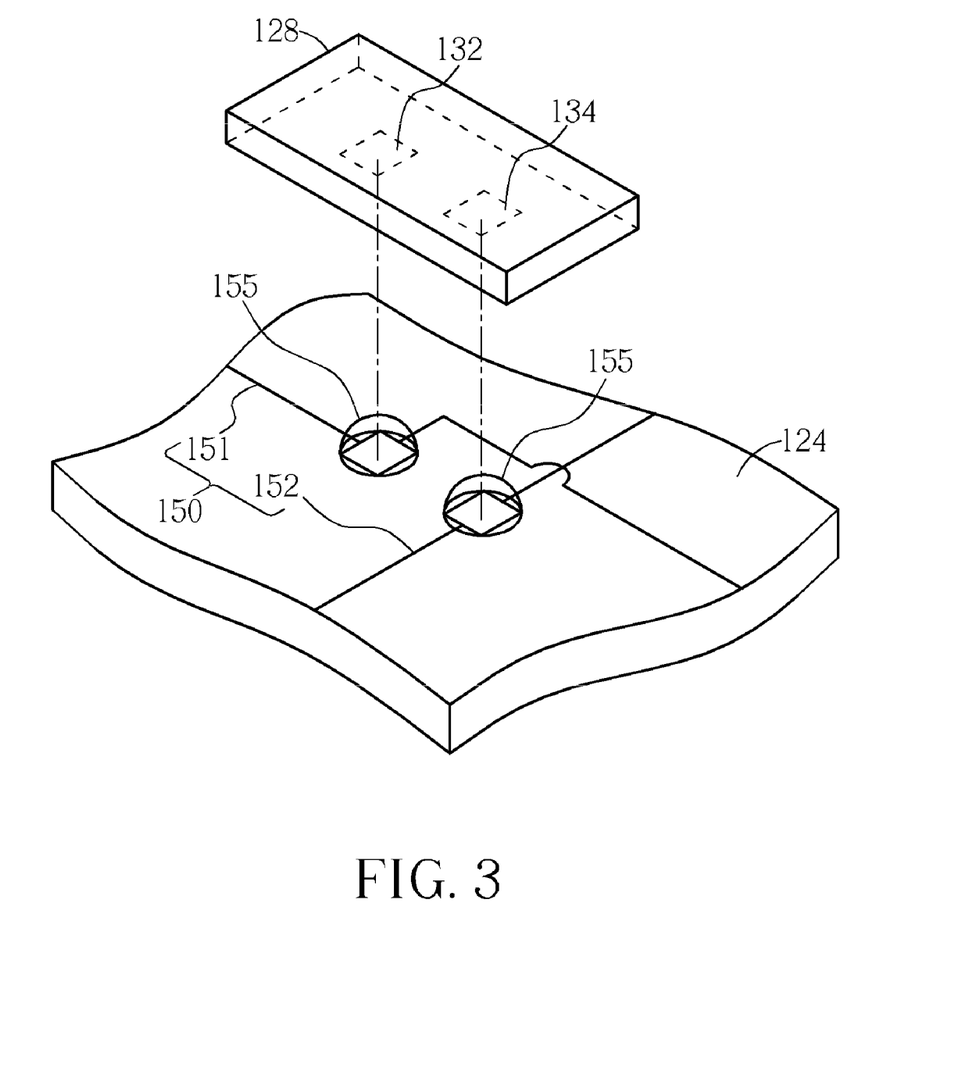
FIG. 3 is a schematic explosion diagram illustrating the LED chips and the first transparent substrate shown in FIG. 1.

Please refer to FIG. 1 through FIG. 3. FIG. 1 is a schematic structural diagram illustrating a LED device 100 in accordance with a first preferred embodiment of the present invention, FIG. 2 is a schematic top view illustrating the first transparent substrate 124 shown in FIG. 1, and FIG. 3 is a schematic explosion diagram illustrating the LED chips 128 and the first transparent substrate 124 shown in FIG. 1. As shown in FIG. 1, an LED device 100 can include a first transparent substrate 124, a plurality of LED chips 128 mounted on the first transparent substrate 124, and a transparent encapsulant 130 covering the LED chips 128. The first transparent substrate 124 can include any light-pervious materials, such as a glass substrate or a plastic substrate. The LED chips 128 can be various types LED chips. It is preferred that each of the LED chips 128 may emits uniform light from both the top surface and the bottom surface, and the emitted light can has a wavelength in the range between 380 nanometers (nm) and 680 nm, but should not be limited thereto. Since the LED chips is disposed on the transparent substrate in the present invention, and the LED chip 128 may emits uniform light from both the top surface and the bottom surface, a dual-side light emitting device can therefore be provided. Although nine the LED chips 128 are shown in FIG. 1 for illustration, number of the LED chips 128 should not be limited by the drawings in the present invention.

The transparent encapsulant 130 can include any proper geometric shapes. In this embodiment, the transparent encapsulant may be semispherical encapsulants, and each of the semispherical encapsulants can encapsulate a corresponding LED chip 128. The transparent encapsulant 130 can include insulating and light-pervious materials that can be solidified and waterproof, such as epoxy resin or silica gel. In addition, the LED chip 128 may be a LED chip with a small wavelength range of the light, so the LED chips 128 may not emit a predetermined color light or a pure white light directly. In order to provide a LED device 100 emitting light in predetermined color, the transparent encapsulant 130 may have at least one first phosphor material 146. The first phosphor material 146 converts a part of the light beam having the first wavelength into a light beam having a second wavelength, and the remaining light beam having the first wavelength and the light beam having the second wavelength are mixed to form a predetermined color light. For example, when the light beam emitted by the LED chips 128 is blue light, the first phosphor material 146 may be a yellow-light emitting phosphor, and a yellow light emitted by the first phosphor material 146 and the remaining blue light are mixed to form a predetermined white light. Therefore, the LED device 100 may be a dual-side white light emitting device. In another embodiment, the first phosphor material 146 may include a red-light emitting phosphor and a green-light emitting phosphor. The red light and the green light emitted by the first phosphor material 146, and the remaining blue light emitted by the LED chips 128 are mixed to form a white light.

In the first embodiment, the first transparent substrate 124 may optionally include a second phosphor material 148 to adjust the appeared light color emitted from the LED chips 128 through the first transparent substrate 124, and the second phosphor material and the first phosphor material may includes the same materials. In another embodiment, the first transparent substrate 124 may include no phosphor.

As shown in FIG. 2, the LED device 100 may include a circuit 150 disposed on the surface of the first transparent substrate 124, and the LED chips 128 may be arranged as a dot matrix on the surface of the first transparent substrate 124. The specific positions of the LED chips 128 should not be limited by FIG. 2. For clearness, the LED chips 128 are shown as a transparent structure in FIG. 2. In fact, the LED chips 128 may be opaque. The circuit 150 may include a plurality of first conductive lines 151 and a plurality of second conductive lines 152. Both the first conductive line 151 and the second conductive line 152 have an external terminal 154 for electrically connecting the LED chips 128 to an external control device (not shown in the drawings). The control device may being electrically connected to both the first conductive lines 151 and the second conductive lines 152 to control the LED chips 128. The LED chips 128 disposed in one line are parallel connected to one of the first conductive lines 151, and the LED chips 128 disposed in one column are parallel connected to one of the second conductive lines 152.

As shown in FIG. 3, each of the LED chips 128 may have a first electrode 132 and a second electrode 134. The first conductive lines 151 and the second conductive lines 152 may be electrically connected to the first electrodes 132 and the second electrodes 134 of the LED chips 128 respectively to control each of the LED chips 128. In order to increase the reliability of connecting the LED chips 128, a connecting material 155 may be included to mount the LED chips 128 on the first transparent substrate 124. For clearness, both the LED chips 128 and the connecting material 155 are shown as a transparent structure in FIG. 3. In fact, the LED chips 128 and the connecting material 155 may be opaque. It is preferred that the connecting material 155 is a eutectic metal, a silver colloid or a silver paste. The eutectic metal, the silver colloid or the silver paste can directly mount the LED chips 128 on the first transparent substrate 124, and electrically connecting the LED chips 128 to the circuit 150 on the first transparent substrate 124.

In the aforementioned embodiment, the transparent encapsulant includes semispherical encapsulants 130 to encapsulate the LED chips 128 respectively, so the individual shapes, sizes or the phosphor material of the transparent encapsulant 130 may be adjusted according to the product requirement or the types of the LED chips 128, and the aforementioned embodiment may use fewer material amount of the transparent encapsulant 130 for the package. However, the present invention should not be limited thereto. In other embodiments, different packaging forms may be adopted in different structures of the LED devices in the present invention.

Figure 4:
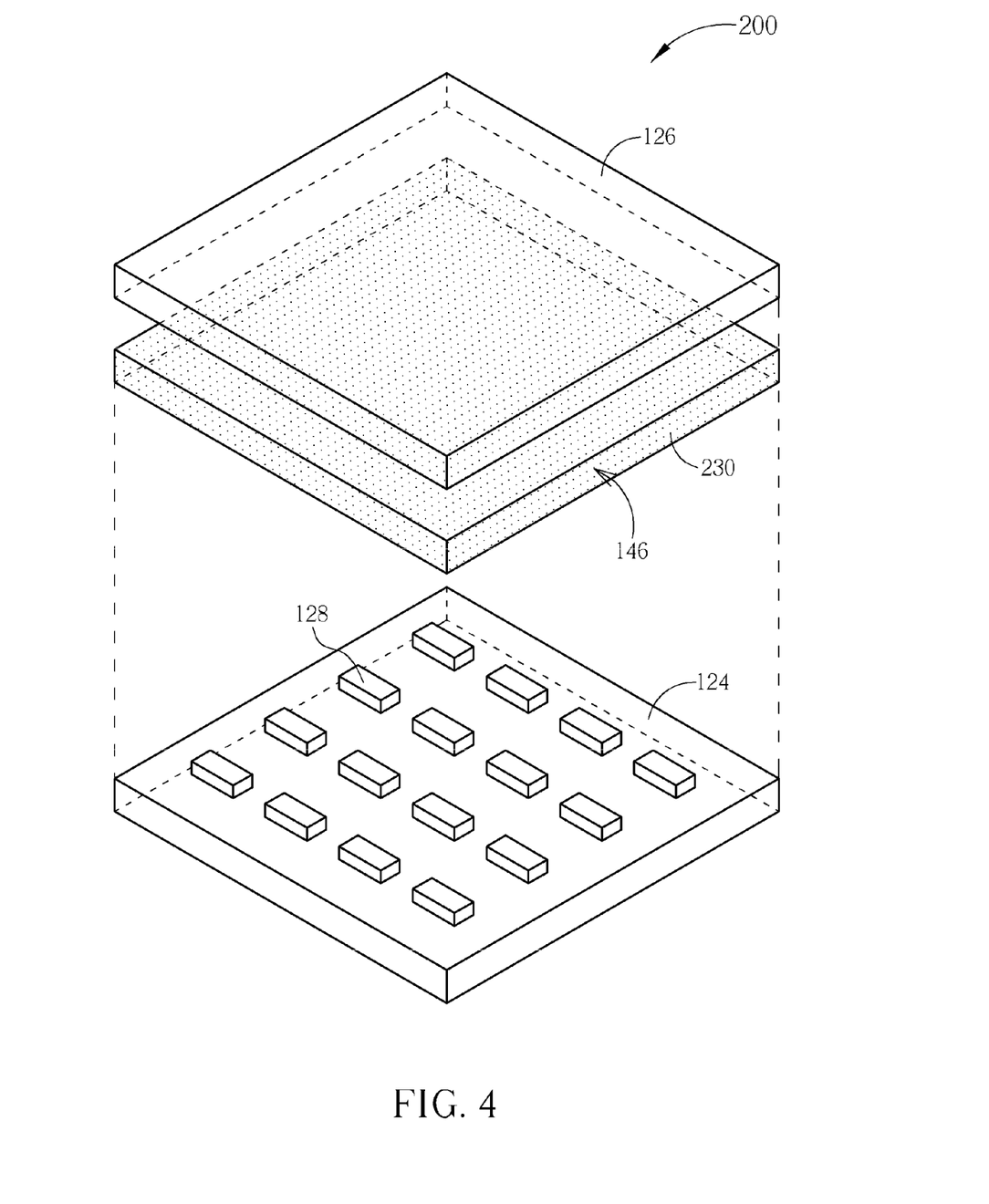
FIG. 4 is a schematic explosion diagram illustrating a LED device in accordance with a second preferred embodiment of the present invention.
Figure 5:
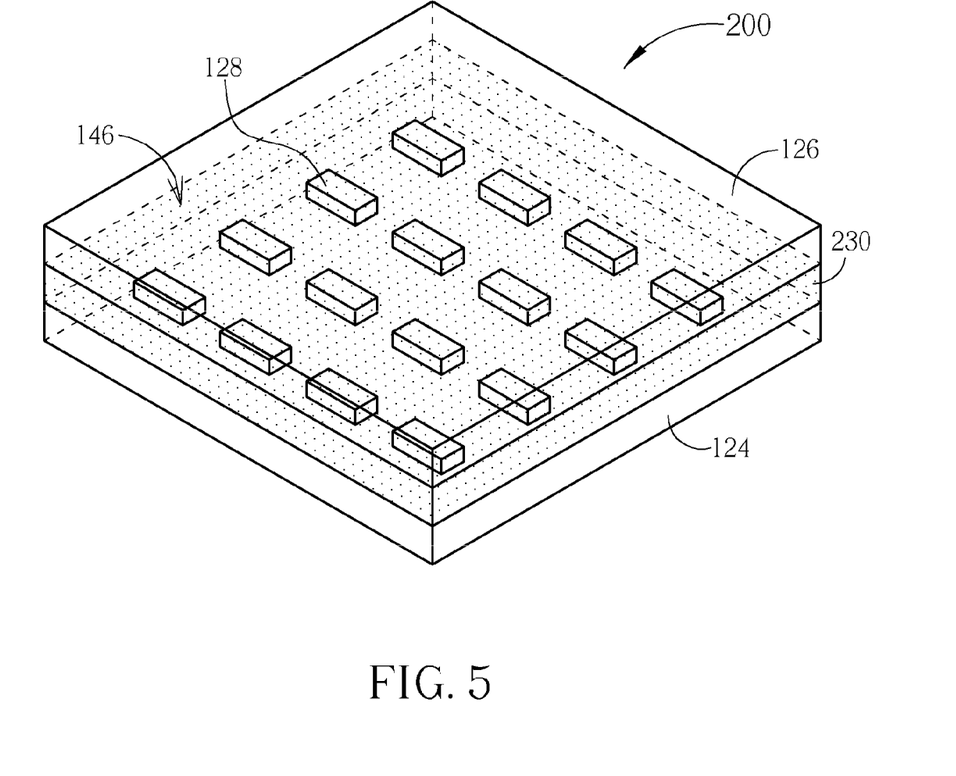
FIG. 5 is a schematic structural diagram illustrating the LED chips shown in FIG. 4.

Please refer to FIG. 4 and FIG. 5. FIG. 4 is a schematic explosion diagram illustrating a LED device 200 in accordance with a second preferred embodiment of the present invention, and FIG. 5 is a schematic structural diagram illustrating the LED chips 200 shown in FIG. 4. As shown in FIG. 4 and FIG. 5, the LED device 200 may include a first transparent substrate 124, a second transparent substrate 126, a plurality of LED chips 128 mounted on the first transparent substrate 124 and arranged in a dot matrix, a transparent encapsulant 230 disposed between the first transparent substrate 124 and the second transparent substrate 126, and a circuit disposed on the first transparent substrate 124 and electrically connected to the LED chips 128. The said circuit in this embodiment is similar to the circuit 150, and not shown in FIG. 4 and FIG. 5. The second transparent substrate 126 can include any light-pervious materials, such as a glass substrate or a plastic substrate, and a connecting material 155 may be included to mount the LED chips 128 on the first transparent substrate 124, but should not be limited thereto.

The transparent encapsulant 230 may be coated on the first transparent substrate 124, and is disposed on all the LED chips 128. The transparent encapsulant 230 can include insulating and light-pervious materials that can be solidified and waterproof, such as epoxy resin or silica gel. In order to provide a LED device 100 emitting light in predetermined color, the transparent encapsulant 130 may also have at least one first phosphor material 146. The first phosphor material 146 may include a yellow-light emitting phosphor, or include a red-light emitting phosphor and a green-light emitting phosphor, but should not be limited thereto.

Accordingly, this embodiment not only can simplify the process of forming the transparent encapsulant 230, but also can protect both the top surface and the bottom surface of the LED chips 128 by the second transparent substrate 126 and the first transparent substrate 124 respectively. As a result, the LED device 200 is more suitable for applying as a dual-side light emitting device.

Figure 6:
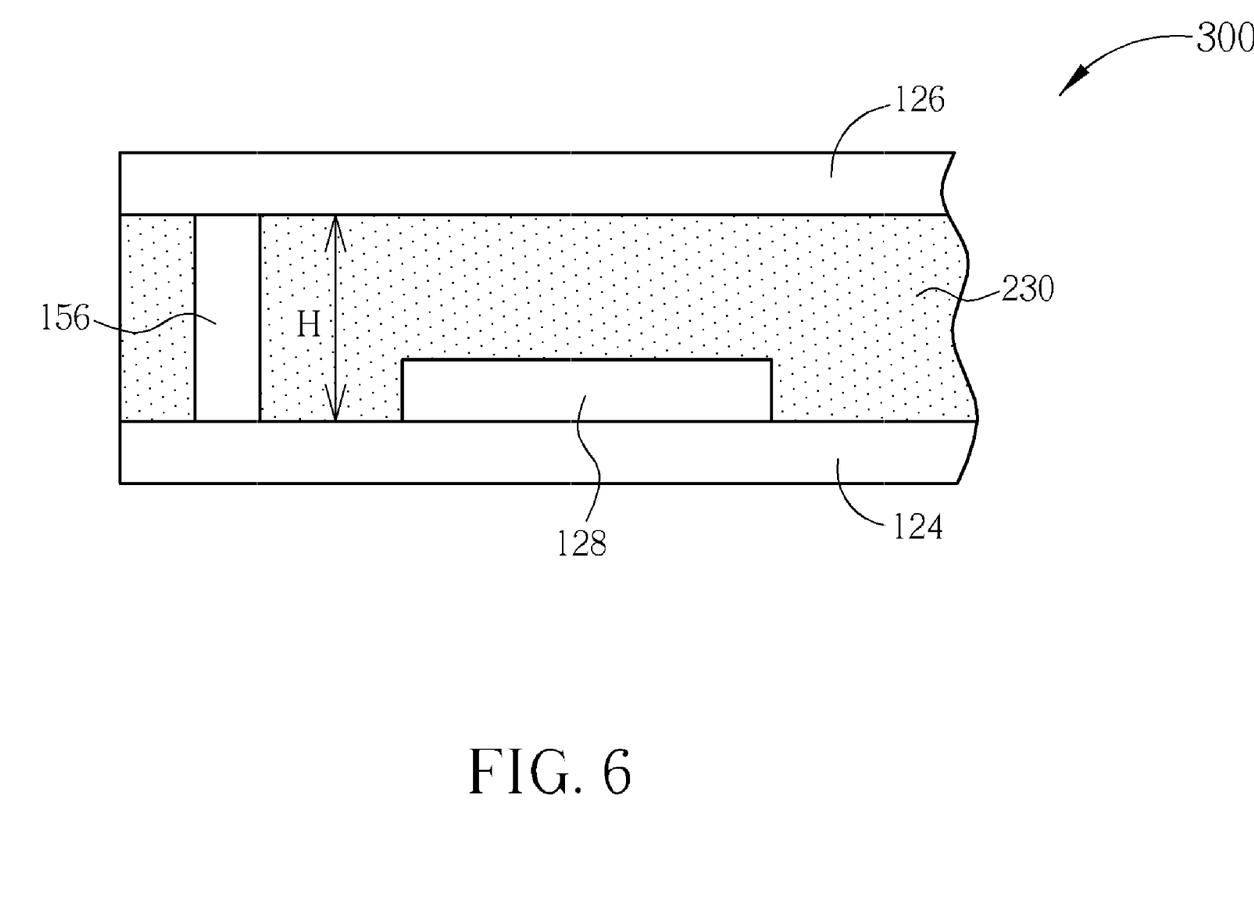
FIG. 6 is a schematic structural diagram illustrating a LED device in accordance with a third h preferred embodiment of the present invention.
Figure 7:
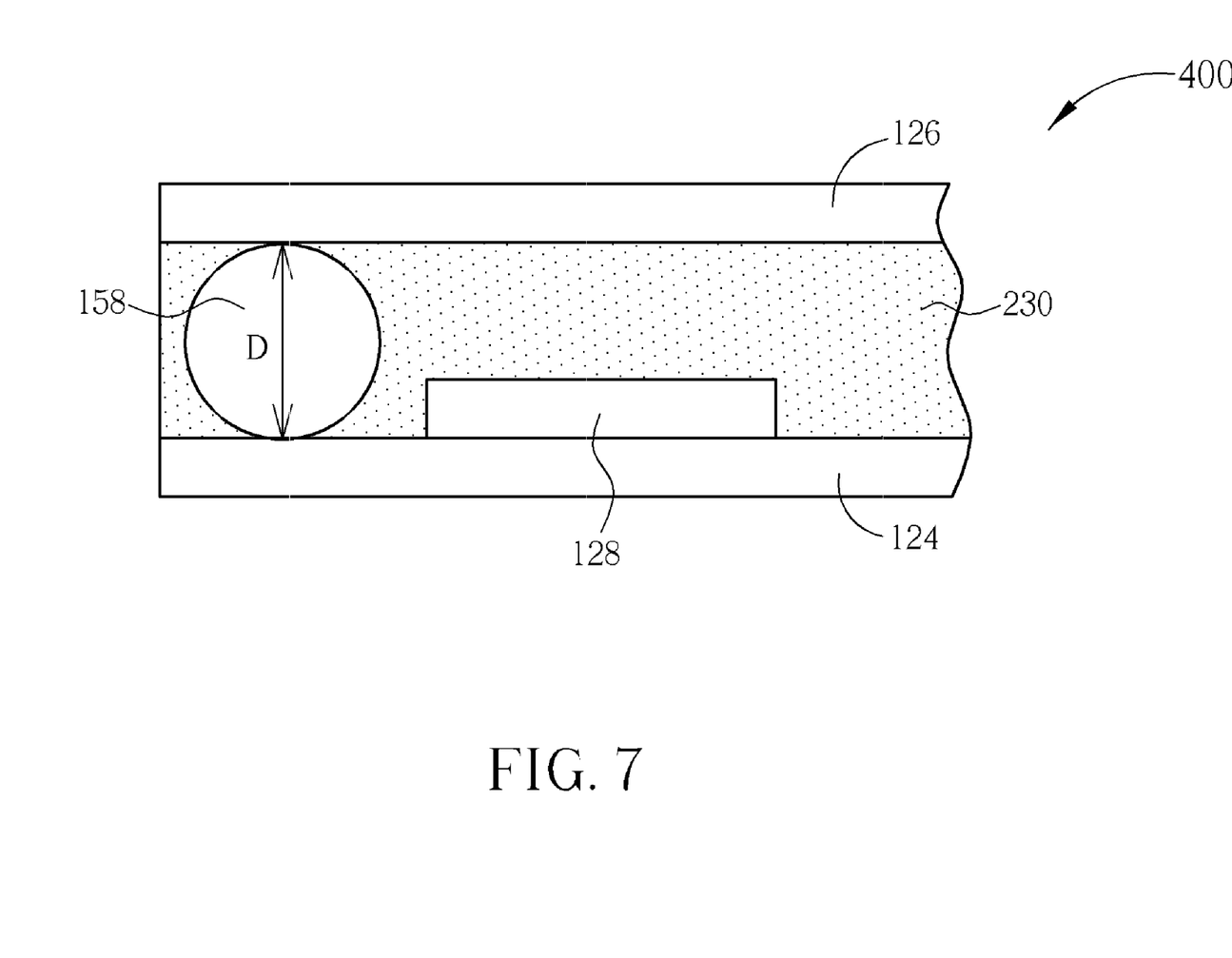
FIG. 7 is a schematic structural diagram illustrating a LED device in accordance with a fourth preferred embodiment of the present invention.

The present invention may further include spacers in order to keep a space between the first transparent substrate 124 and the second transparent substrate 126 for disposing the LED chips 128. Please refer to FIG. 6 and FIG. 7. FIG. 6 and FIG. 7 are schematic structural diagrams illustrating a LED device 300 and a LED device 400 in accordance with a third and fourth preferred embodiments of the present invention respectively. As shown in FIG. 6, the main difference between the LED device 200 and the LED device 300 is that the LED device 300 may further include at least one spacer, such as a pad 156, disposed around the LED chips 128. For instance, the LED device 300 may further include a rectangular frame-like pad surrounding all the LED chips 128 to keep a space between the first transparent substrate 124 and the second transparent substrate 126 for disposing the LED chips 128. The height H of the pad 156 is preferably larger than the thickness of the LED chips 128, and the pad 156 may preferably include transparent materials. As shown in FIG. 7, the main difference between the LED device 200 and the LED device 400 is that the transparent encapsulant 230 of the LED device 400 may further include a plurality of spacers, such as spherical spacers 158 in this embodiment. The spherical spacers 158 may directly mixed in materials of the transparent encapsulant 230 so as to keep a space between the first transparent substrate 124 and the second transparent substrate 126 for disposing the LED chips 128. The diameter D of the spherical spacers 158 may larger than the thickness of the LED chips 128, and the spherical spacers 158 may preferably include transparent materials.

Figure 8:
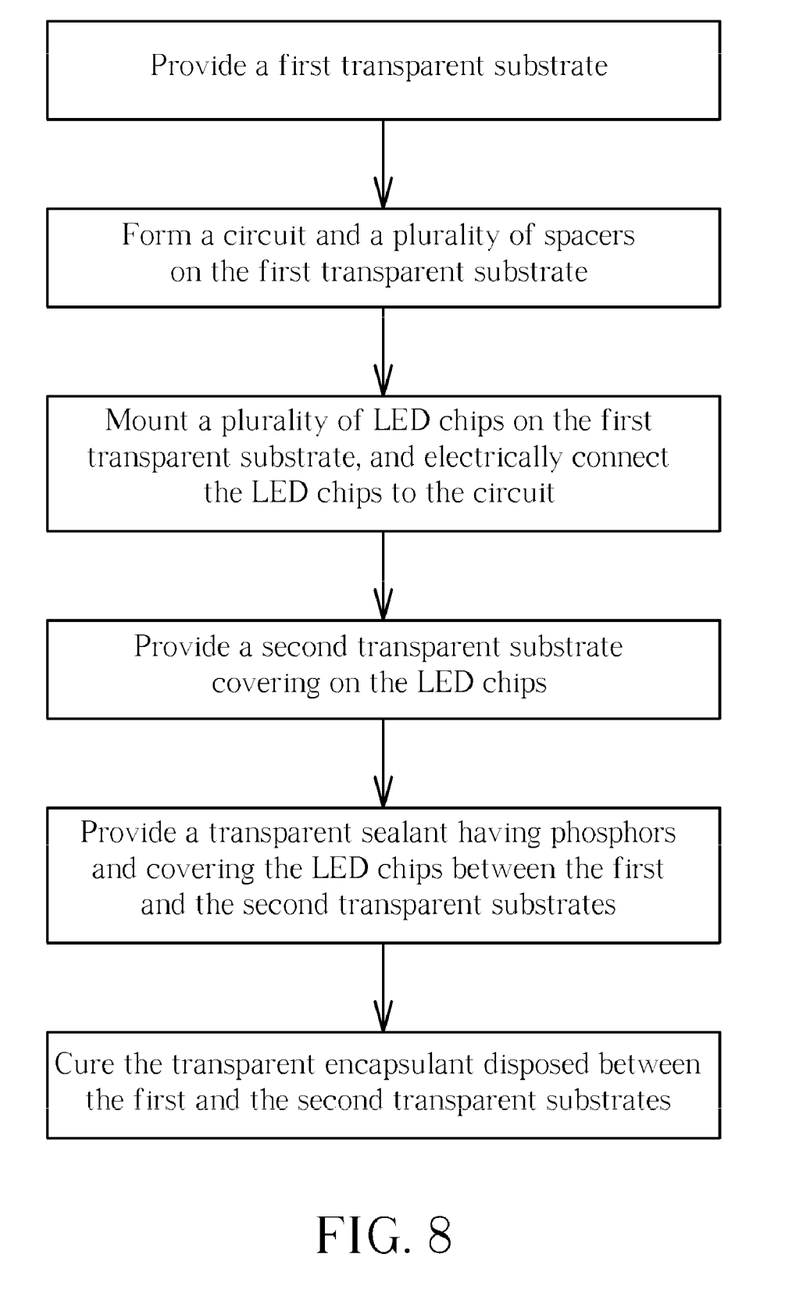
FIG. 8 is a schematic flow chart illustrating a method of packaging a LED device according to a fifth preferred embodiment of the present invention.

Furthermore, a method of packaging a LED device is provided to the utilization of the transparent substrate in the present invention. Please refer to FIG. 8. FIG. 8 is a schematic flow chart illustrating a method of packaging a LED device according to a fifth preferred embodiment of the present invention. This flow chart may shows the aforementioned steps of forming the structures of the first through the fourth embodiments, so the structures shown in FIG. 1 through FIG. 5 may also be referred to in the steps of FIG. 8.

As shown in FIG. 8, a transparent substrate is first provided, such as the first transparent substrate 124. Subsequently, at least one metal evaporation process and at least one lithography process are performed in turn to form a circuit 150 on the surface of the first transparent substrate 124. Thereafter, at least one spacer is disposed on the first transparent substrate 124 to support the first transparent substrate 124 and the following-formed second transparent substrate 126. Next, a plurality of LED chips 128 are provided. The LED chips 128 may be directly mounted on the first transparent substrate 124 by a conductive glue or eutectic materials, and a eutectic metal, a silver colloid or a silver paste may electrically connecting the LED chips 128 to the circuit 150 on the first transparent substrate 124. After that, a second transparent substrate 126 covering the LED chips 128 is provided.

Next, a transparent encapsulant is formed on the first transparent substrate 124 to encapsulate the LED chips 128. For example, the transparent encapsulant 130 or the transparent encapsulant 230 may be formed, and the transparent encapsulants 130, 230 may include at least one phosphor material. The transparent encapsulant may be disposed on the first transparent substrate 214 by coating process or may be disposed between the first transparent substrate 124 and the second transparent substrate 126 by filling process. Thereafter, a curing process may be preformed on the transparent encapsulants 130, 230 to form the LED device.

In comparison with the traditional LED device, the present invention may include the following benefits. First, since a transparent substrate is utilized to support the LED chips in the present invention, the LED device can therefore be a dual-side light emitting device. Subsequently, since the transparent encapsulant or the transparent substrate may have phosphor materials to adjust the appeared light color of the LED device, the LED device may be a dual-side white light emitting device. In addition, since the LED chips are directly mounted on the transparent substrate, and may be directly connected to the circuit of the transparent substrate, processes of packaging the LED device may be simplified in the present invention, and a chip-level LED device can be provided. Furthermore, the LED chips of the present invention may be arranged as a dot matrix on the transparent substrate, and the circuit has metal traces arranged as a checker corresponding to the LED chips can turn on/off each of the LED chips. Thus, the LED device can be a display device that shows images or information on two opposite side, a lighting device that can adjust its brightness, luminance or light-emitting description, or a light source module. It is noticed that the arrangement of the LED chips should not be limited to the above-mentioned embodiment in the present invention, and the LED chips may be arranged in a single line, in random, or the present invention may even include only one LED chip in an LED device.

Those skilled in the art will readily observe that numerous modifications and alterations of the device and method may be made while retaining the teachings of the invention.

What is claimed is:

1. A light emitting diode (LED) device, comprising:
a first transparent substrate;
a second transparent substrate;
a plurality of LED chips arranged as a dot matrix and mounted on the first transparent substrate to emit at least one light beam having a first wavelength;
a transparent encapsulant encapsulating the LED chips and being arranged between the first transparent substrate and the second transparent substrate; and
a circuit formed on the first transparent substrate, and electrically connected to the LED chips, wherein the LED chips emit a part of the light beam going from one side of the first transparent substrate and penetrating through the second transparent substrate and emit a part of light beam penetrating through the first transparent substrate and going toward the opposite side thereof.

2. The LED device of claim 1, wherein the transparent encapsulant comprises at least one phosphor material, the phosphor material converts a part of the light beam having the first wavelength into a light beam having a second wavelength, and the remaining light beam having the first wavelength and the light beam having the second wavelength are mixed to form a predetermined color light.

3. The LED device of claim 2, wherein the light beam emitted by the LED chips is a blue light, the phosphor material comprises a yellow-light emitting phosphor, and a yellow light emitted by the phosphor material and the remaining blue light are mixed to form a white light.

4. The LED device of claim 2, wherein the light beam emitted by the LED chips is a blue light, the phosphor material comprises a red-light emitting phosphor and a green-light emitting phosphor, and the red light and the green light emitted by the phosphor materials, and the remaining blue light emitted by the LED chips are mixed to form a white light.

5. The LED device of claim 2, wherein a range of the first wavelength is between 380 nanometers (nm) and 680 nm.

6. The LED device of claim 5, further comprising a connecting material to mount the LED chips on the first transparent substrate, wherein the connecting material is a eutectic metal, a silver colloid or a silver paste.

7. The LED device of claim 1, wherein the transparent encapsulant comprises a plurality of semispherical encapsulants, and each of the semispherical encapsulants encapsulates each of the LED chips respectively.

8. The LED device of claim 1, wherein the transparent encapsulant comprises an encapsulating layer, the encapsulating layer covers the first transparent substrate.

9. The LED device of claim 1, further comprising a spacer disposed between the first transparent substrate and the second transparent substrate.

10. The LED device of claim 1, wherein the circuit comprises a plurality of first conductive lines and a plurality of second conductive lines, each of the LED chips has a first electrode and a second electrode, the first conductive lines are electrically connected to the first electrodes, and the second conductive lines are electrically connected to the second electrodes.

11. The LED device of claim 10, further comprising a control device electrically connected to the first conductive lines and the second conductive lines to control the LED chips.

12. The LED device of claim 10, wherein the LED chips disposed in one line are parallel connected to one of the first conductive lines, and the LED chips disposed in one column are parallel connected to one of the second conductive lines.

13. A method of packaging a light emitting diode (LED) device, comprising:
    providing a first transparent substrate;
    forming a circuit on the first transparent substrate;
    mounting a plurality of LED chips on the transparent substrate, and electrically connecting the LED chips to the circuit;
    forming a transparent encapsulant on the first transparent substrate to encapsulate the LED chips; and
    combining a second transparent substrate with the first transparent substrate and the transparent encapsulant, and the transparent encapsulant being disposed between the first transparent substrate and the second transparent substrate, wherein the LED chips emit a part of the light beam going from one side of the first transparent substrate and penetrating through the second transparent substrate and emit a part of light beam penetratin through the first transparent substrate and going toward the opposite side thereof.

14. The method of claim 13, wherein the transparent encapsulant comprises at least one phosphor material.

15. The method of claim 13, wherein the transparent encapsulant is disposed on the first transparent substrate by a coating process.

16. The method of claim 13, further comprising a step of performing at least one metal evaporation process and a step of performing at least one lithography process to form the circuit on the first transparent substrate.

17. The method of claim 13, further comprising a step of providing at least one spacer on the first transparent substrate to support the first transparent substrate and the second transparent substrate.

18. The method of claim 13, further comprising curing the transparent encapsulant.

19. A light emitting diode (LED) device, comprising:
    a first transparent substrate;
    a second transparent substrate parallel to the first transparent substrate;
    a plurality of LED chips disposed between the first transparent and the second transparent substrate to emit at least one light beam, wherein the LED chips are disposed on the first transparent substrate, wherein the LED chips emit a part of the light beam going from one side of the first transparent substrate and penetrating through the second transparent substrate and emit a part of light beam penetrating through the first transparent substrate and going toward the opposite side thereof;
    a transparent encapsulant disposed between the first transparent substrate and the second transparent substrate, wherein the transparent encapsulant covers the LED chips;
    a circuit disposed between the first transparent substrate and the second transparent substrate, wherein the circuit is disposed on the first transparent substrate, and electrically connected to the LED chips; and
    at least one spacer disposed between the first transparent substrate and the second transparent substrate, wherein the spacer surrounds the LED chips to keep a space between the first transparent substrate and the second transparent substrate.

20. The LED device of claim 19, wherein the spacer includes a rectangular frame-like pad or a spherical spacer.

* * * * *